United States Patent [19]

Popiovic

[11] Patent Number: 4,782,375
[45] Date of Patent: Nov. 1, 1988

[54] INTEGRATABLE HALL ELEMENT
[75] Inventor: Radivoje Popovic, Zug, Switzerland
[73] Assignee: LGZ Landis & Gyr Zug, Zug, Switzerland
[21] Appl. No.: 946,149
[22] Filed: Dec. 19, 1986

Related U.S. Application Data

[63] Continuation of Ser. No. 675,717, Nov. 28, 1984, abandoned.

[30] Foreign Application Priority Data

Dec. 19, 1983 [CH] Switzerland .................. 6739/83

[51] Int. Cl.⁴ .......................................... H01L 43/06
[52] U.S. Cl. .................................................. 357/27
[58] Field of Search ................... 357/27; 324/251, 252

[56] References Cited

U.S. PATENT DOCUMENTS

| | | | |
|---|---|---|---|
| 3,683,242 | 8/1972 | Hutson | 357/27 |
| 3,692,595 | 9/1972 | Hudson, Jr. | 357/27 |
| 3,823,354 | 7/1974 | Janssen | 357/27 |
| 3,994,010 | 11/1976 | Geske | 357/27 |
| 4,250,518 | 2/1981 | Bloodworth et al. | 357/27 |
| 4,253,107 | 2/1981 | Macdougal | 357/27 |
| 4,315,273 | 2/1982 | Yamamoto et al. | 357/27 |
| 4,516,144 | 5/1985 | Jaskolski et al. | 357/27 |

FOREIGN PATENT DOCUMENTS 96219 12/1983 European Pat. Off. ............. 357/27
2412949 7/1979 France .

OTHER PUBLICATIONS

Zieren, IEEE IEDM, Dec. 1980, Technical Digest, pp. 669–672.
IEEE Electron Device Letters, vol. EDL4, No. 3, Mar. 1983, pp. 51–53.

Primary Examiner—William D. Larkins
Attorney, Agent, or Firm—Marmorek, Guttman & Rubenstein

[57] ABSTRACT

In an integrable Hall element, which includes a semiconductor layer of a single conductive type, a plurality of current electrodes adapted for being connected to an energy source, and wherein at least one current electrode and two sensor electrodes are located on a surface of the Hall element, and the one current electrode has a first connecting contact forming a first energy source pole, the improvement comprises the one current electrode being approximately located in the center of a line connecting the sensor electrodes. The remaining current electrodes are distributed current electrodes which have a second connecting contact, and a second energy source pole is formed by the distributed current electrodes; the distributed electrodes are so located with respect to the one current electrode so that all currents flowing between the one electrode and the distributed electrodes form a resultant current vector extending in the vicinity of the one current electrode substantially at right angles to the surface of the semiconductor layer.

20 Claims, 5 Drawing Sheets

Fig. 9
Fig. 10
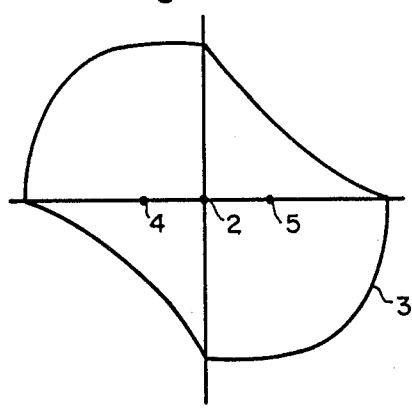
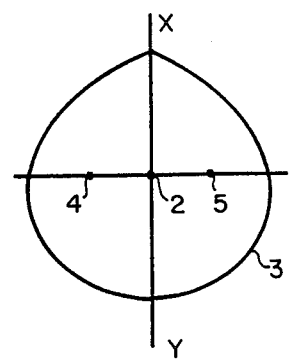
Fig. 11
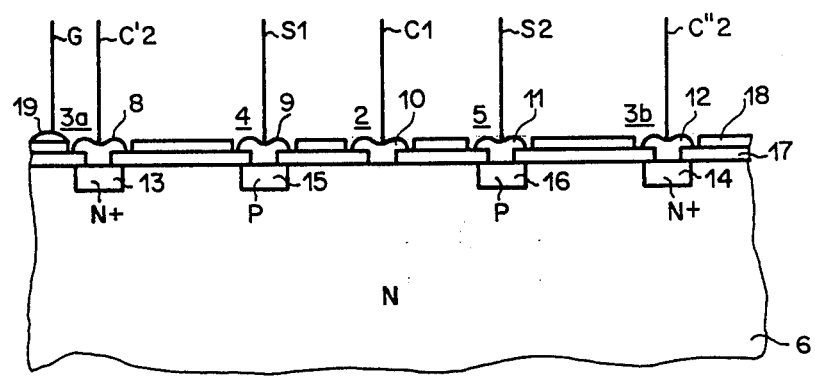
Fig. 12
Fig. 13
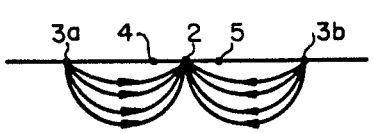
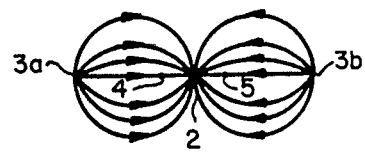

INTEGRATABLE HALL ELEMENT

This is a continuation of application Ser. No. 675,717 filed Nov. 28, 1984, now abandoned.

BACKGROUND OF THE INVENTION

The invention relates to an integratable Hall element which comprises a semi-conductor layer of a single conductivity type, on whose surface there are disposed two sensor electrodes and at least one current electrode of several current electrodes, and wherein the current electrodes serve to be connected to an energy source and the one current electrode is equipped with a first connecting contact which forms a first supply pole.

The Hall element can be used as a magnetic field sensor, for example in an electricity counter, or in an output meter for measuring the current consumed, which, as is known, is proportional to the magnetic field generated by the current.

From U.S. Pat. No. 4,253,107 there has become known an integrated Hall element, which measures a magnetic field acting at right angles to its surface, as can be ascertained, for example from column 1, lines 14 through 20 and from FIG. 2.

Furthermore there are known integrated magnetic field sensors, for example magnetic diodes and magnetic transistors, which measure a magnetic field acting parallel to its surface. Their construction is more complicated than that of Hall elements. Furthermore they are rather temperature-sensitive and in principle have a non-linear characteristic line. They are further sensitive with respect to shot noise. A magneto-transistor of this type is, for example, known from IEEE Electron Device letters, Volume EDL-4, No 3, March 1983, pages 51 to 53 "An investigation of the sensitivity of lateral magneto-transistors" R. S. Popovic et al.

SUMMARY OF THE INVENTION

It is an object of the invention to implement a magnetic field sensor for measurement of a magnetic field acting parallel to its surface, which may be part of a conventional integrated circuit in standard bipolar or standard CMOS technology, which has a sensitivity of the order of magnitude of at least 1 Volt/(mA. Tesla), instead of the hitherto available approximately 200 mV/(mA. Tesla), which operates according to the Hall effect principle, and therefore is a simple unipolar construction element with all advantages thereof.

The aforesaid object is realized by an integratable Hall element, which comprises a semiconductor layer of a single conductivity type, on whose surface there are arranged two sensor electrodes and at least a first current electrode of several current electrodes, wherein the current electrodes are connected to an energy source, and the first current electrode has a connecting contact forming a first supply pole; the improvement comprises in the first current electrode being disposed approximately in the center between the sensor electrodes and approximately on a straight line connecting the sensor electrodes, and by distributed current electrodes, which have a connecting contact, forming the second supply pole, and which are so arranged that all currents operatively formed between the current electrodes form a vectorially resultant current, which extends in the vicinity of the first current electrode substantially at right angles to the surface of the semiconductor layer.

BRIEF DESCRIPTION OF THE DRAWINGS

For a full understanding of the nature and objects of the invention, reference should be had to the following detailed description, taken in connection with the accompanying drawing in which:

FIG. 4 is a cross section of a Hall element according to FIG. 3, in which a semiconductor layer of an integrated circuit is built-in;

FIG. 9 is a plan view of a current electrode disposed approximately in axial symmetry with respect to a straight line, FIG. 10 is a plan view of a current electrode disposed approximately symmetrically with respect to a plane surface, FIG. 11 is a cross-section of an integratable Hall element having distributed and approximately point-shaped current electrodes, FIG. 12 is a schematic representation in cross-section of the current distribution of a Hall element according to FIG. 11, FIG. 13 is a schematic representation in plan view of the current distribution of a Hall element according to FIG. 11.

In all Figs. of the drawing identical reference numerals denote respective identical parts.

DESCRIPTION OF THE PREFERRED EMBODIMENTS

Figure 1:
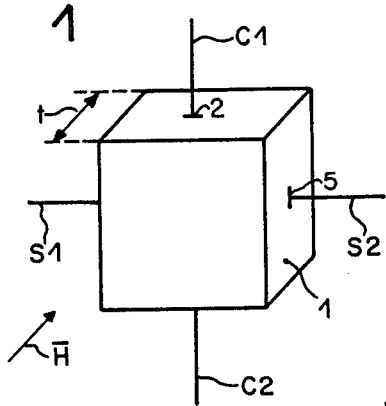
FIG. 1 is a perspective view of a Hall element of the prior art.

The known Hall element shown in FIG. 1 comprises a smemiconductor crystal 1 in the shape of a right-angled parallel-epipede, and where respective opposite sides each form a pair of sides. The sides of the first side pair are formed with respective current connectors C1 and C2, while the sides of a second side pair are equipped with respective sensor connectors S1 and S2. A magnetic field $\overline{H}$ which is to be measured extends parallel to the thickness of the Hall element, and consequently at right angles to the third side pair. The thickness of the Hall element is denoted by the value t. It will be assumed that all connection points of the current connectors C1 and C2, as well as those of the sensor connectors S1 and S2 are in a common plane.

In what follows it will be assumed that the connecting points of the current connectors C1, C2, S1 and S2 may not only be point-connectors, but may also be shaped in the form of a surface. They will therefore be denoted generally as current electrodes or sensor electrodes, and the respective connecting points with the associated current connectors or sensor connectors C1, C2, S1, or S2 will be denoted as connecting contacts.

Each Hall element includes therefore a first current electrode 2 provided with a first current connector C1, and a first current connecting contact, a second current electrode 3 provided with a second current connector C2, and a second current connecting contact, a first sensor electrode 4 formed with a first sensor connector S1 and a first sensor connecting contact, and a second sensor electrode 5 formed with a second sensor connector S2, and a second sensor connecting contact.

The current electrodes 2 and 3 serve for being connected to a current source, and wherein the first current connecting contact forms a first current pole. The second current connecting contact, and optionally further current connecting contacts are connected at least through one electrical connection, which conducts more or less well, to a second supply pole.

The connecting contacts need not be disposed in the center of the respective electrode surfaces.

Figure 2:
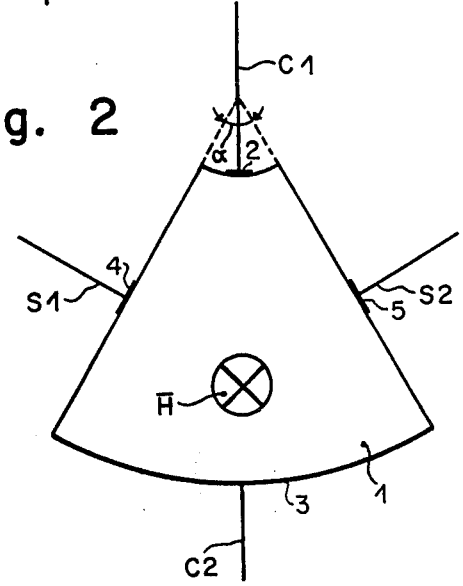
FIG. 2 is a cross-section of a modified Hall element.
Figure 3:
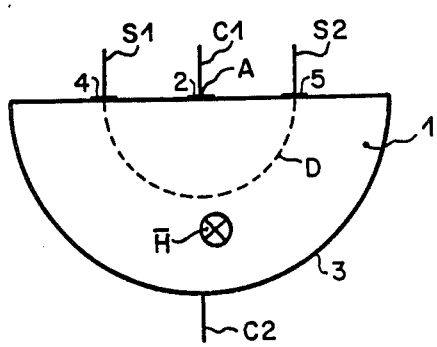
FIG. 3 is a cross section of a further modified Hall element.

In what follows it will be assumed that the surfaces of the first current electrode 2, and those of both sensor electrodes 4 and 5 are very small, and that in a first approximation they can be assumed to be point-shaped and be disposed at the respective surface centers, while the second electrode 3 shown in FIGS. 2 and 3 covers the entire surface of the associated side of the whole element.

The modified Hall element of FIG. 2 corresponds approximately to the Hall element of FIG. 1, except that here the sides of the third side pair have the form of respective annular segments, so that in the illustrated cross-section the sides of the first side pair have the shape of concentric arcs, while the sides of the second side pair are no longer parallel but are radii in the cross-section shown, which subtend a center angle alpha with one another. The magnetic field $\overline{H}$ to be measured therefore acts both in FIG. 2, as well in the following FIGS. 3 and 4 at right angles to the plane of the paper, for example from the front to the rear.

The further modified Hall element of FIG. 3 corresponds to the Hall element of FIG. 2, in which the center angle alpha has a value of 180 degrees, so that in the cross-section shown it forms the shape of a semicircle. The cross-section of that side of the first side pair, which is formed with a current connector C1, is then reduced to the center point A of the semicircle.

Figure 4:
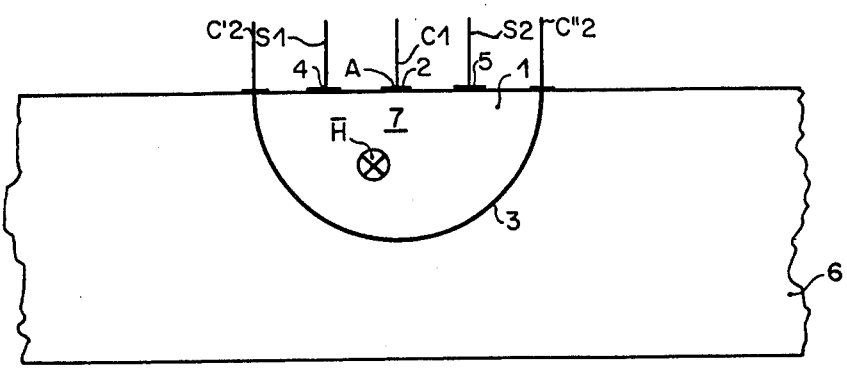

In FIG. 4 the modified Hall element shown in FIG. 3 is disposed on the surface of a semiconductor layer 6 of a single conductive type P or N in such a manner, that the diameter of the semi-circle, which is formed with the approximately point-shaped sensor electrodes 4 and 5, as well as with the approximately point-shaped first current electrode 2, is disposed on the surface of the semiconductor layer 6.

In FIGS. 2 and 3 the surface-like second current electrode 3 is formed with a single current-connecting contact disposed approximately in the center of its surface for the second current connector C2. The second current electrode 3 can, however, also be equipped with several current-connecting contacts. If the Hall element is used in an intergrated circuit, then it is advantageous to dispose this current-connecting contact of the second current electrode 3, as is illustrated in FIG. 4, directly on the surface of the semiconductor layer 6 of the integrated circuit. In that case all connecting contacts of the Hall element are disposed on the surface of the integrated circuit. In FIG. 4 the presence of only two current-connecting contacts of the second current electrode 3 has been assumed, which are formed with respective current connectors C'2 and C"2.

The first current electrode 2 is disposed as shown in FIGS. 3 and 4 at least approximately in the center between the sensor electrodes 4 and 5, and at least approximately along a straight line connecting the sensor electrodes 4 and 5. The part of the semiconductor layer 6, which is disposed below the first current electrode 2 and both sensor electrodes 4 and 5 forms the active portion 7 of the Hall element.

The surface of the second current electrode 3 has, as seen in FIGS. 3 and 4, a relatively ideal cylindrical shape with a semicircular cross-section. Based on the assumption, that the first current electrode 2 has a very short longitudinal shape in a surface-plane which extends at right angles to the semicircular cross-section, that the height of the cylindrically shaped second current electrode 3 is equal to the length of the first current electrode 2, and that during operation electical currents pass from the second current electrode 3 to the first current electrode 2, distribution of the currents within the Hall element can be seen from FIGS. 5 and 6. As seen in cross-section, all currents according to FIG. 5 pass radially symmetrically from the cylindrically shaped second current electrode 3 to the first current electrode 2. As seen in plan view, however, all currents, according to FIG. 3, pass along a thin disc at right angles to the second current electrode 2. In that case both sensor electrodes 4 and 5 are each preferably longitudinally shaped, and each has an length equal to that of the first current electrode 2.

Figure 5:
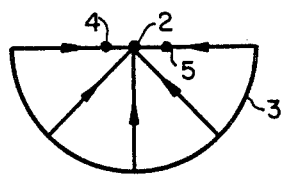
FIG. 5 is a schematic illustration of the current distribution in cross-section of a Hall element having a cylindrically shaped current electrode.
Figure 6:
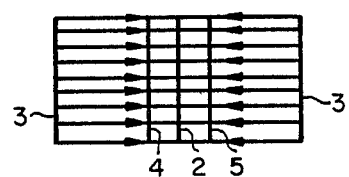
FIG. 6 is a schematic representation of the current distribution in a plan view of the Hall element according to FIG. 5.
Figure 7:
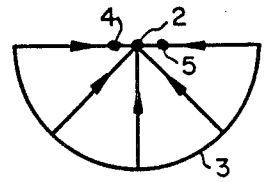
FIG. 7 is a schematic representation of the current distribution in cross section of a Hall element having a hemispherical current electrode.
Figure 8:
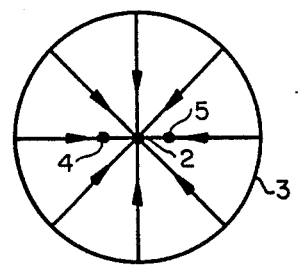
FIG. 8 is a schematic representation of the current distribution in plan view of the Hall element according to FIG. 7.

The current distribution shown in cross-section in FIG. 7 of a Hall element having a hemispherical second current electrode is identical with the current distribution shown in FIG. 5; the associate current distribution in plan view, shown in FIG. 8, is, however, symmetrically radial, namely all currents pass in the plan view of FIG. 8 radially from the second current electrode 3 to the first current electrode 2.

The second current electrode 3 shown in FIG. 9 is arranged to be approximately axially symmetrical to a straight line, which in turn passes through the assumed point-shaped first current electrode 2 at right angles to the surface of the semiconductor layer 6, namely the plan view of the second current electrode 3 shown in FIG. 9 is arranged in point symmetry with respect to the first current electrode 2.

The second current electrode 3 shown in FIG. 10 is disposed approximately symmetrically to a plane surface, which passes through the first current electrode 2 at right angles to a straight line connecting the also approximately assumed point-shaped sensor electrodes 4 and 5, namely the plan view of the second current electrode 3 shown in FIG. 10 is axially symmetrical to a straight line XY, which passes through the first current electrode 2 at right angles to the straight line connecting the sensor electrodes 4 and 5.

The current-connecting contacts of the integratable Hall element may be in part Schottky diode contacts, or may all be ohmic or metallic contacts. The sensor-connecting contacts, however, can additionally be normal P/N diode contacts.

In FIG. 11, for example, the current-connecting contacts of the current connectors C'2 and C"2 are formed as ohmic or metallic contacts, the current connecting contacts of the first current connector C1 is formed as a Schottky diode contact, and the sensor connecting contacts of the sensor connectors S1 and S2 are formed as P/N diode contacts. The integratable Hall element shown in FIG. 11 corresponds approximately to the Hall element shown in FIG. 4, except that here the surface-like second current electrode 3 has been reduced to 2 distributed and approximately point-like current electrodes 3a and 3b, which are spatially disposed where the two current-connecting contacts of the current connectors C'2 and C"2 are located. The Hall element shown in FIG. 11 consequently comprises a semi-conductor layer 6 of a certain conductivity type, for example of the type N, on whose surface there are present five metallic connecting contacts 8, 9, 10, 11, and 12 of the current connectors or sensor connectors C'2, S1, C1, S2, C"2, respectively. Below both outer metallic connecting contacts 8 and 12, and in an intimate contact therewith there are disposed on the surface of the semiconductor layer 6 diffusion contacts 13 and 14 of the same conductivity type as that of the semiconductor material, namely they are diffused thereinto, and are strongly doped with foreign atoms. The contact combinations 8;13 and 12;14 represent ohmic or metallic contacts and form each a distributed and approximately point-shaped second current electrode 3a or 3b having respective current connectors C'2 or C"2. The center of the metallic connecting contact 10 does not have any diffusion-contact, therefore represents a Schottky diode contact, and forms the first current electrode 2 with the first current connector C1. Below the two remaining metallic connecting contacts 9 and 11 there remain in the semiconductor layer 6 on its surface diffusion contacts 15 and 16, respectively, which are of an opposite conductivity type than that of the semi-conductor layer 6. The contact combinations 9;15 and 11;16 represent P/N diode contacts, and form each a sensor electrode 4 or 5 with respective sensor connectors S1 or S2. The surface of the semiconductor layer 6 is covered completely with a thin electrically insulating passivation layer 17, for example comprises $SiO_2$ which in turn, is facultatively or optionally completely covered with an electrically well-conducting "gate" 18 of metal or polysilicone, and where the passivation layer 17 and the "gate" 18 are formed with passages for the connecting contacts. The "gate" 18 includes a connecting contact 19 for the gate connection G. The "gate" 18 and the metallic contacts 8 through 12 are electrically insulated from one another. Through the gate connector G there is applied onto the connecting contact 19 of the "gate" 18 an electrical voltage, which may serve to control the sensitivity of the Hall element.

The current distribution within the Hall element shown in FIG. 11 is illustrated in cross-section in FIG. 12, and in plan view in FIG. 13. The electrical currents pass both in cross-section as well as in plan view from the approximately point-shaped current electrodes 3a and 3b so as to initially diverge in an arcuate manner, but finally converge in an arcuate manner towards the first current electrode 2.

Figure 14:
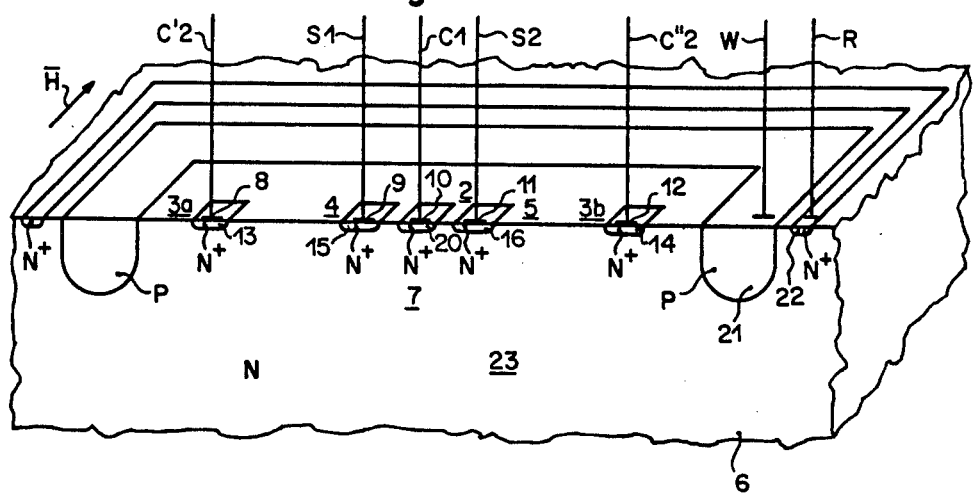
FIG. 14 is a perspective view of one-half of an integratable Hall element using CMOS technology.

The Hall element shown in FIG. 14 corresponds approximately to the Hall element shown in FIG. 11, with the exception that here the passivation layer 17 and the "gate" 18 have been omitted, all connecting contacts have been shown only schematically as pure ohmic or metallic contacts, so that the central metallic connector contact 10 is also formed with a diffusion-contact. All five diffusion contacts 13, 15, 20, 16, and 14 shown in FIG. 14 are strongly doped with foreign atoms, and are all of the same conductivity type as the semiconductor layer 6. The Hall element shown in FIG. 14 is additionally surrounded laterally in an annular manner completely by an insulating or barrier layer 21, which is deeply diffused into the surface of the semiconductor layer 6 and has an annular longitudinal shape. The insulating layer 21 comprises, for example, of material having an opposite conductivity type from that of the semiconductor layer 6, in the present example therefore is of the type P, and has a connecting contact with a wire connector W disposed in an arbitrary location. The insulating layer 21 surrounds in practice always at least the first current electrode 2, namely here the contact combination 10;20, and both sensor electrodes 4 and 5, namely here the contact combinations 9;15 and 11;16. The center of the longitudinal-annular insulation layer 21 is formed approximately by the first current electrode 2. Its longitudinal axis extends approximately parallel to the straight connecting line of the sensor electrodes 4 and 5. Its depth exceeds considerably the depth of the contact region of the connecting contacts. The insulating layer 21 is disposed so as to be axially symmetrical to a straight line which passes through the first current electrode 2 at right angles to the surface of the semiconductor layer 6, or is symmetrical to a plane surface which extends through the first current electrode 2 at right angles to the straight line connecting the sensor electrodes 4 and 5. The insulating layer 21, in turn, as sbown in FIG. 14, is surrounded additionally by an electrically well-conducting equipotential diffusion layer 22 spaced therefrom, the diffusion layer 22 being continuous, annularly shaped, thin, and strongly doped with foreign atoms. The diffusion layer 22 comprises material of the same conductivity type as the semiconductor layer 6, and also has a connecting contact at an arbitrary location provided with a wire connection denoted by the letter R. The semiconductor layer 6 is, in CMOS technology, either a N-substrate, or a N-well, which is diffused into a substrate of opposite conductivity type weakly doped with foreign atoms. The two approximately point-shaped contact combinations 8;13 and 12;14, as well as the equipotential-diffusion layer 22 are at distributed current electrodes, which together form the second current electrode 3. In practice also only the contact combinations 8;13 and 12;14, or only the equipotential-diffusion layer 22 can be present as a second current electrode 3. The equipotential-diffusion layer 22 forms a continuous surface and is disposed on the upper surface of the semiconductor layer 6. In any case it surrounds completely or partially in an annular manner at least the first current electrode 2 and both sensor electrodes 4 and 5, and wherein the first current electrode 2 is disposed at least approximately in the center of the annular surface.

Figure 15:
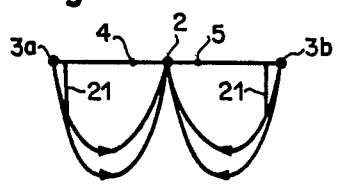
FIG. 15 is a schematic representation of the current distribution in cross-section of a Hall element according to FIG. 14 in the absence of any equipotential diffusion layer.
Figure 16:
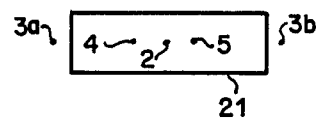
FIG. 16 is a schematic representation of the current distribution in plan view of a Hall element according to FIG. 15.

The current distribution within the Hall element shown in FIG. 14 without, however, any equipotential diffusion layer 22, is shown in cross-section in FIG. 15, and in plan view in FIG. 16. It has been assumed that the distributed point-like current electrodes 3a and 3b are disposed external to the insulating layer 21, in contrast to the illustration shown in FIG. 14. The electric currents pass, as seen in cross-section of FIG. 15, emanating from both current electrodes 3a and 3b, so as to pass in depth downwardly around the deep insulation layer 21, and reach the first current electrode 2 in an almost vertical manner passing upwardly from below. In the plan view of FIG. 16 no surface currents can be seen to pass, as such a passage has been prevented by the insulating layer 21.

Figure 17:
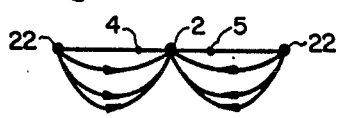
FIG. 17 is a schematic representation of the current distribution in cross-section of a Hall element according to FIG. 14 in the absence of any insulating layer, and in the absence of any distributed point-shaped current electrodes.
Figure 18:
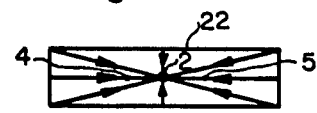
FIG. 18 is a schematic representation of the current distribution in plan view of a Hall element according to FIG. 17.

The current distribution of the Hall element shown in FIG. 14 in the absence of any insulating layer 21, and in the absence of any distributed point-shaped current electrodes 3a and 3b is shown in cross-section in FIG. 17, and in plan view in FIG. 18. The current distribution in cross-section is similar to that in FIG. 12, while in the plan view all currents radiate symmetrically radially from the equipotential diffusion layer 22, assumed to be rectangular, to the first current electrode 2.

Figure 19:
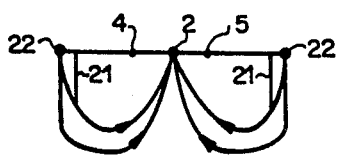
FIG. 19 is a schematic representation of the current distribution in cross-section of a Hall element according to FIG. 14 in the absence of any distributed point-shaped current electrodes.
Figure 20:
FIG. 20 is a schematic representation of the current distribution in plan view of the Hall element according to FIG. 19.

The current distribution within the Hall element shown in FIG. 14, in the absence of any distributed point-shaped current electrodes 3a and 3b, is shown in cross-section in FIG. 19, and in plan view in FIG. 20. The current distribution in cross-section of FIG. 19 is similar to that of FIG. 15. If the length of the first current electrode 2 has approximately the same magnitude as the very small width of the annular longitudinal equipotential diffusion layer 22 and is disposed parallel to that width, then, as seen in plan view of FIG. 20, all currents pass at a depth in the semi-conductor layer 6 and are therefore shown dotted, being more or less parallel to the the equipotential diffusion layer 22, namely they always emanate therefrom passing towards to the first current electrode 2. In that case both sensor electrodes 4 and 5 have preferably also a longitudinal and similar shape to that of the first current electrode 2.

Figure 21:
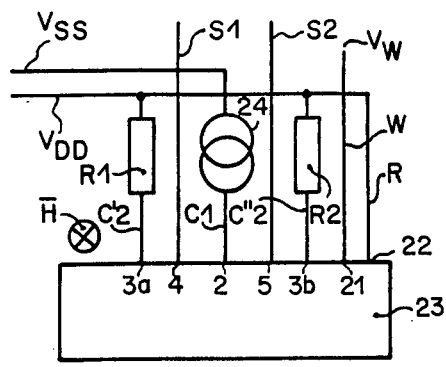
FIG. 21 is a schematic circuit in conjunction with an integratable Hall element according to FIG. 14.

The Hall element 23 of FIG. 14 is to be connected into a circuit as shown in FIG. 21. This means that the central first current electrode 2 is connected externally to a pole of a current source 24, and the other pole of the current source 24, is, for example, connected to a negative pole $V_{SS}$ of a voltage source, while the equipotential diffusion layer 22 is connected directly, and both distributed current electrodes 3a and 3b are connected through resistors R1 and R2, respectively, to the other pole $V_{DD}$ of the voltage source. The insulation layer 21 is connected to an electrical voltage $V_W$, which is so selected that during operation the P/N junction of the semi-conductor layer 6 to the layer 21 has a polarity to inhibit operation (i.e. reverse bias) and consequently is more negative than the voltage $V_{C1}$ applied to the first current electrode 2. The voltage $V_W$ of the insulating layer 21 may serve to control the sensitivity of the Hall element 23. If the semi-conductor layer 6 comprises Si, then the insulating layer 21 may be made from $SiO_2$, and does not require any wire connection W.

Figure 22:
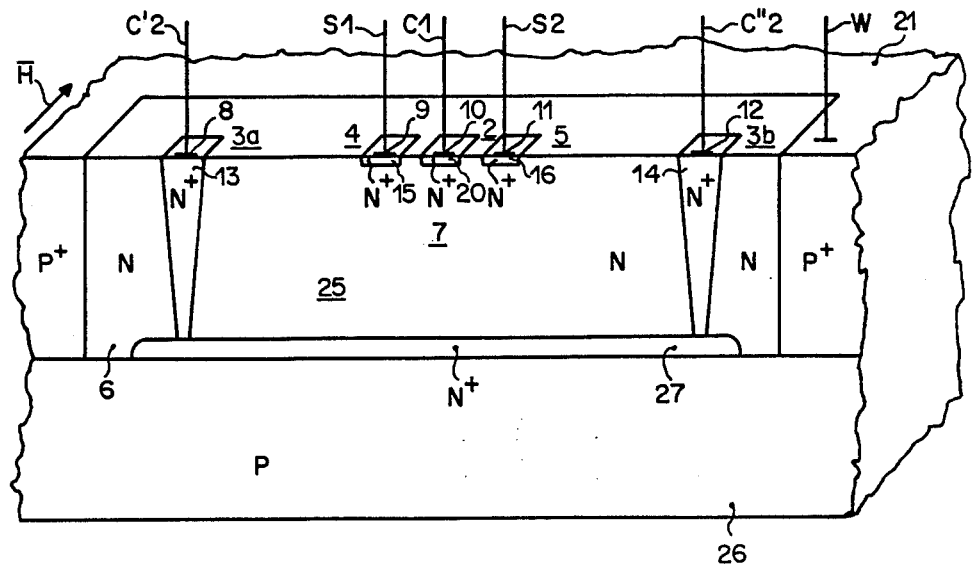
FIG. 22 is a perspective view of one-half of an integratable Hall element in bipolar technology.

The integratable Hall element 25 of FIG. 22 corresponds approximately to the integratable Hall element 23 of FIG. 14, except that the semiconductor layer 6 has been grown as an epitaxial layer on a substrate 26 of an opposite conductivity type, namely of the type P, that no equipotential diffusion layer 22 exists, and that the longitudinal annular insulation layer 21 is strongly doped with foreign atoms, and is diffused at a depth up to the contact with the substrate 26. Furthermore, below the active portion 7 the Hall element 25, at the border between the substrate 26 and the semiconductor layer 6, and parallel to the surface of the semiconductor layer 6, there is embedded in the semiductor layer 6 well-conducting "buried layer" 27 of the same conductivity type as that of the semiconductor layer 6, which is strongly doped with foreign atoms. Furthermore the two distributed and approximately point-shaped current electrodes 3a and 3b can be facultatively or optionally extended in depth downwardly up to the contact with the "buried layer" 27. The buried layer 27, together with the two distributed and approximately point-shaped current electrodes 3a and 3b, forms the second current electrode 3, whose connecting contact, if no contact occurs between the point-shaped current electrodes 3a and 3b of the buried layer 27, is disposed in a non-illustrated and electrically insulated manner externally to the active portion 7 of the Hall element 25 on the surface of the semiconductor layer 6, and is furthermore connected to the semiconductor layer 6 therewithin through an electrically ohmic or metallic, and more or less well conducting connection.

The circuit connections to the integratable Hall element 25 of FIG. 22 are similar to those of the Hall element 23 of FIG. 14, the wire connection R being missing, however, while the connection W in the stated conductivity type P is connected to the negative pole $V_{SSe}$ of the voltage source.

Figure 23:
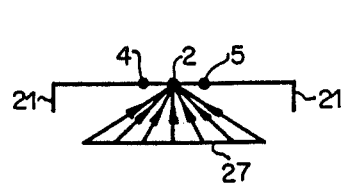
FIG. 23 is a schematic representation of the current distribution in cross-section of a Hall element according to FIG. 2 in the absence of distributed point-shaped current electrodes.
Figure 24:
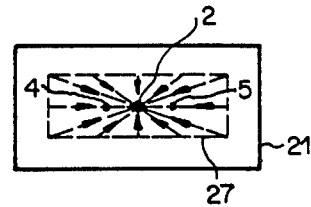
FIG. 24 is a schematic representation of the current distribution in plan view of a Hall element according to FIG. 23.

The current distribution of the Hall element shown within FIG. 22, in the absence of the two distributed point-shaped current electrodes 3a and 3b, is illustrated in cross-section in FIG. 23 and in top plan view in FIG. 24. The currents, as seen in cross-section of FIG. 23, all flow concentrically in a symmetric fashion, and in depth in the semi-conductor layer 6, and emanate from the buried layer 27, which here has the function of a second current electrode 3, so as to reach the point-shaped first current electrode 2. In the top plan view of FIG. 24 the currents also flow in depth in the semi-conductor layer 6, therefore shown dotted, in a symmetrically concentric manner, namely emanating from the buried layer 27, so as to pass to, and reach the first point-shaped current electrode 2.

Operation

If in the Hall element shown in FIG. 1, a current I flows through current connectors C1, C2, then, as is known, a Hall voltage arises between the sensor connectors S1 and S2. If this Hall element is now deformed so that it assumes sequentially the shape according to FIG. 2 and according to FIG. 3, then the operation of the Hall element does not change in principle. Also its sensitivity remains approximately the same. The Hall voltage between the sensor connectors S1 and S2 of the Hall element shown in FIG. 3 is given by:

$$V^H_{S1-S2} = \int_{S1}^{S2} \vec{E_H} \, \vec{dl} \qquad (4)$$

wherein $\vec{E_H}$ is the electrical Hall field, and $\vec{dl}$ is a partial path of an arbitrary connecting path between the sensor connectors S1 and S2. If, as shown in FIG. 3, the integration path, which connects the sensor connectors S1 and S2 is chosen to be the semicircle D, (see FIG. 3), the center of which is equal to the center point A, then equation (1) yields the value:

$$V^H_{S1-S2} = (R_H \cdot I \cdot B)/t, \qquad (2)$$

wherein $R_H \approx 1/(q.n)$, wherein q is the elementary charge, n the density of the majority charged carrier, t the thickness of the Hall element, I the value of the current between the current connectors C1 and C2, and $B = \mu H$ represents the value of the magnetic induction of the magnetic field $\overline{H}$ to be measured. Equation (2) is exactly equal to the equation, which applies for the Hall element shown in FIG. 1. It is an advantage of the Hall element shown in FIG. 3, that it can be built in, according to FIG. 4, into a semiconductor layer of an electrically insulated member of an integrated circuit.

The second current electrode 3 need not absolutely have the shape shown in FIG. 4. It further does not absolutely require a continuous surface, but may, for example, comprises several distributed and approximately point-shaped current electrodes, which are formed with a connecting contact, and which are spatially so arranged, that all currents flowing during operation form a vectorial resultant current, which, at least in the vicinity of the first current electrode, extends substantially at right angles to the surface of the semiconductor layer 6. At least a portion of the distributed current electrodes is, for example, arranged for this purpose pairwise in axial symmetry to a straight line, which passes through the first current electrode 2 at right angles to the surface of the semiconductor layer 6. At least a portion of the remaining distributed current electrodes, which are not arranged to be in axial symmetry, are then arranged for this purpose pairwise and approximately symmetrically with respect to a plane surface, which extends through the first current electrode 2 at right angles to a straight connecting line between the sensor electrodes 4 and 5. Also, for example, all distributed current electrodes may be disposed pairwise in symmetry with respect to the aforementioned surface.

At least a portion of the distributed current electrodes can, for example, form electrically well-conducting, and continuous surface portions, which in turn are pairwise identical, and also are symmetrically arranged with respect to the respective straight line, or to the respective plane surface, as the distributed point-shaped current electrodes, from which they are assembled. All surface portions are, for example, arranged to extend parallel to the surface of the semi-conductor layer 6, or parallel surface portions all lie in one plane, or form all together a single continuous surface.

The second current electrode 3 comprises, for example, as seen in FIG. 4, of a single cylindrically-shaped continuous symmetrical surface, as seen in FIG. 9 of a single axially symmetric continuous surface, as seen in FIG. 10 of a single continuous surface, which is symmetrical, as seen in FIG. 11 of only two distributed and approximately point-shaped symmetrically disposed current electrodes 3a and 3b, as seen in FIG. 14 of two distributed, approximately point-shaped and symmetrically disposed current electrodes 3a and 3b, and a continuous symmetrically equipotential diffusion layer 22, and as seen in FIG. 22 of two distributed, approximately point-shaped and symmetrically disposed current electrodes 3a 3b, and a continuous symmetrically disposed buried layer 27 extending parallel to the surface.

All these arrangements of the second current electrode 3 lead to the fact, as can be already ascertained from FIGS. 5 through 8, FIGS. 12 through 13, FIGS. 15 through 20, and FIGS. 23 through 24, and the current distributions shown therein, that all electrical currents are distributed symmetrically during operation, and more or less radially between the first and second current electrodes 2 and 3, so that their vectorial current resultant in the vicinity of the first current electrode 2 extends substantially at right angles to the surface of the semiconductor layer 6.

All distributed surface portions or point-shaped current electrodes of the second current electrode 3 must be connected through an electrically more or less well-conducting connection with at least one connecting contact, which then forms the second supply pole of the Hall element.

The electrically well-conducting continuous surface portions and surfaces of the second current electrode 3 comprises, for example, of a semiconductor material, which is strongly doped with foreign atoms, and is of the same current conductivity P or N as the semiconductor layer 6.

The semiconductor layer 6 is, for example in the bipolar technology an epitaxial layer, which has been grown on a substrate (see FIG. 2), or is, in the CMOS technology a well, which is diffused into a substrate, and wherein the substrate is of the opposite conductivity type from that of the semiconductor layer 6. The semiconductor layer 6 comprises Si or of GaAs, and wherein the use of GaAs results in a higher sensitivity of the Hall element, and is doped approximately uniformly with foreign atoms.

The part of the semiconductor layer 6, which in the Hall element 23 shown in FIG. 14 is disposed immediately external to the Hall element proper, must be connected to a positive pole $V_{DD}$ of the supply voltage of the highest electrical potential available in the integrated circuit with the aid of the equipotential diffusion layer 22, according to FIG. 21, in the case of the conductivity type N, so that any interference between the Hall element 23 and the remainder of the integrated circuit is avoided. In FIG. 22 the insulating layer 21 takes over this task, namely to insulate the Hall element 24 with respect to the remainder of the intergrated circuit electrically.

It is additionally the object of the insulating layer 22 to transform the current distributions in both FIGS. 14 and 21 in the active portion 7 of the Hall element 23 or 25 from a rather radial hemispherical distribution, into a radial-cylindrical distribution as shown, for example, in FIG. 20, and wherein the small height of the radial-cylindrical current distribution lends that current distribution a disc-shaped appearance, which benefits the sensitivity of the Hall element 23 or 25.

The use of the resistors R1 and R2 shown in FIG. 21 is facultative, or optional, and their values are to be selected to be relatively small, for example approximately equal to 1 kOhm. They can be used so as to cancel any offset voltage.

The gate "18" of the Hall element shown in FIG. 1 with a voltage applied to the gate connector G stablizes the surface properties, and therefore the characteristics of the Hall element, reduces its surface-related noise, and improves its sensitivity.

The integratable Hall element serves for the measurement of a magnetic field component acting parallel to its surface at a corresponding spatial arrangement of a magnetic field acting parallel to its surface. This has the advantage that the magnetic field cannot induce in the current paths extending parallel to the surface of the integrated circuit any voltages falsifying or disturbing the measurement result. The Hall element is, for example, a part of an electricity counter, and the magnetic field is, for example generated by the current to be measured.

The use of a standard bipolar, or standard CMOS technology has the advantage, that a desired change in the properties of the Hall element, for example an improvement of its sensitivity, does not require any changes of the thickness of the layer extending at right angles to the surface of the Hall element, but only a change in the width of the layers, namely a change of the mask.

I wish it to be understood that I do not desire to be limited to the exact details of construction shown and described, for obvious modifications will occur to a person skilled in the art.

Having thus described the invention, what I claim as new and desired to be secured by Letters Patent, is as follows:

1. An integratable Hall element comprising:
    a semiconductor layer having a major surface and having a thickness;
    first and second sensor electrodes spaced apart from each other and at the major surface for deriving an electric Hall voltage between said first and second sensor electrodes;
    a first current electrode at the major surface and located substantially at the midpoint of a straight line connecting said first and said second sensor electrodes; and
    a plurality of additional current electrodes spaced away from said first current electrode, wherein at least some of said additional current electrodes are disposed approximately symmetrically about an axis which passes through said first current electrode at approximately a right angle to said major surface;
    the thickness of said semiconductor layer being greater than the distance between said first and second sensor electrodes for enabling electrical currents to flow between said first current electrode and said additional current electrode along paths extending deeply into said semiconductor layer so that sufficient portions of the paths of the electrical currents are substantially perpendicular to the major surface below said first current electrode to provide said Hall element with sensitivity to a magnetic field component substantially parallel to the major surface.

2. An integratable Hall element comprising:
    a semiconductor layer having a major surface and having a thickness;
    first and second sensor electrodes spaced apart from each other and at the major surface for deriving an electric Hall voltage between said first and second sensor electrodes;
    a first current electrode at the major surface and located substantially at the midpoint of a straight line connecting said first and said second sensor electrodes; and
    a plurality of additional current electrodes spaced away from said first current electrode, wherein at least some of said additional current electrodes are disposed approximately symmetrically about a plane surface which passes through said first current electrode at approximately a right angle to the line connecting said sensor electrodes;
    the thickness of said semiconductor layer being greater than the distance between said first and second sensor electrodes for enabling electrical currents to flow between said first current electrode and said additional current electrodes along paths extending deeply into said semiconductor layer so that sufficient portions of the paths of the electrical currents are substantially perpendicular to the major surface below said first current electrode to provide said Hall element with sensitivity to a magnetic field component substantially parallel to the major surface.

3. The integratable Hall element as claimed in claim 1, wherein the remaining of said additional current electrodes are disposed approximately symmetrically about a plane surface which passes through said first current electrode at approximately a right angle to the line connecting said sensor electrodes.

4. The integratable Hall element as claimed in claim 1 or claim 2 or claim 3, further comprising a connecting contact associated with each of two of said additional current electrodes, two resistors selected to cancel an offset voltage inherent in said Hall element and a current source; said resistors connecting each of said additional current electrodes, respectively, to one terminal of said current source.

5. The integratable Hall element as claimed in claim 1 or claim 2 or claim 3, further comprising a connecting contact associated with each of two of said additional current electrodes and two resistors selected to cancel an offset voltage inherent in said Hall element; said resistors being connected to each of said connecting contacts, respectively.

6. The integratable Hall element as claimed in claim 1, wherein at least some of said additional current electrodes are each defined by at least one relatively large electrically conducting surface portion.

7. The integratable Hall element as claimed in claim 2, wherein at least some of said additional current electrodes are each defined by at least one relatively large electrically conducting surface portion.

8. The integratable Hall element as claimed in claim 3, wherein at least some of said additional current electrodes are each defined by at least one relatively large electrically conducting surface portion.

9. The integratable Hall element as claimed in claim 1, wherein at least some of said additional current electrodes are each defined by relatively large electrically conducting surface portions and said surface portions form pairs symmetrically disposed about said axis.

10. The integratable Hall element as claimed in claim 2, wherein at least some of said additional current electrodes are each defined by relatively large electrically conducting surface portions and said surface portions form pairs symmetrically disposed about said plane surface.

11. The integratable Hall element as claimed in claim 3, wherein at least some of said additional current electrodes are each defined by relatively large electrically conducting surface portions, some of said surface portions form pairs symmetrically disposed about said axis and the remaining of said surface portions form pairs symmetrically disposed about said plane surface.

12. The integratable Hall element as claimed in claim 6, wherein said surface portion is disposed parallel to said major surface.

13. The integratable Hall element as claimed in claim 7, wherein said surface portion is disposed parallel to said major surface.

14. The integratable Hall element as claimed in claim 8, wherein said surface portion is disposed parallel to said major surface.

15. The integratable Hall element as claimed in claim 9, wherein all of said surface portions are disposed parallel to said major surface.

16. The integratable Hall element as claimed in claim 10, wherein all of said surface portions are disposed parallel to said major surface.

17. The integratable Hall element as claimed in claim 11, wherein all of said surface portions are disposed parallel to said major surface.

18. The integratable Hall element as claimed in claim 15 or claim 16 or claim 17, wherein all of said surface portions lie in a common plane.

19. The integratable Hall element as claimed in claim 1 or claim 2 or claim 3, wherein at least some of said first and said additional current electrodes and said sensor electrodes are each defined as a surface portion comprising a connecting contact to each of said first and said additional current electrodes and said sensor electrodes, at least a part of each of said connecting contacts being a metallic contact disposed at said major surface.

20. The integratable Hall element as claimed in claim 1 or claim 2 or claim 3, wherein at least some of said first and said additional current electrodes and said sensor electrodes are each defined as a surface portion comprising a semiconductor material, further comprising a connecting contact to each of said first and said additional current electrodes and said sensor electrodes, at least a part of each of said connecting contacts being a metallic contact disposed at said major surface and a diffusion contact below said metallic contact and in intimate contact with said metallic contact, said diffusion contacts being strongly doped with foreign atoms, and being of the same type of conductivity as that of said semiconductor material, said diffusion contacts being diffused into said semiconductor material.

* * * * *